United States Patent
Doan et al.

(10) Patent No.: US 10,410,845 B2
(45) Date of Patent: Sep. 10, 2019

(54) USING BIAS RF PULSING TO EFFECTIVELY CLEAN ELECTROSTATIC CHUCK (ESC)

(71) Applicant: APPLIED MATERIALS, INC., Santa Clara, CA (US)

(72) Inventors: Kenny Linh Doan, Santa Clara, CA (US); Usama Dadu, Santa Clara, CA (US); Wonseok Lee, Santa Clara, CA (US); Daisuke Shimizu, Santa Clara, CA (US); Li Ling, Santa Clara, CA (US); Kevin Choi, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/821,661

(22) Filed: Nov. 22, 2017

(65) Prior Publication Data

US 2019/0157052 A1 May 23, 2019

(51) Int. Cl.

| | |
|---|---|
| H01L 21/00 | (2006.01) |
| H01J 37/32 | (2006.01) |
| H02N 13/00 | (2006.01) |
| H01L 21/683 | (2006.01) |
| B08B 5/00 | (2006.01) |
| B08B 7/00 | (2006.01) |
| H01L 21/67 | (2006.01) |

(52) U.S. Cl.
CPC .......... *H01J 37/32862* (2013.01); *B08B 5/00* (2013.01); *B08B 7/0071* (2013.01); *H01J 37/32146* (2013.01); *H01J 37/32816* (2013.01); *H01L 21/6831* (2013.01); *H02N 13/00* (2013.01); *H01J 37/32724* (2013.01); *H01L 21/67069* (2013.01)

(58) Field of Classification Search
None
See application file for complete search history.

(56) References Cited

U.S. PATENT DOCUMENTS

| | | | | |
|---|---|---|---|---|
| 6,305,390 | B1 * | 10/2001 | Jeon | C23C 16/4405 134/1.1 |
| 7,959,970 | B2 | 6/2011 | Gaudet et al. | |
| 8,518,209 | B2 | 8/2013 | Hudson et al. | |
| 2005/0260354 | A1 * | 11/2005 | Singh | H01J 37/32412 427/523 |
| 2009/0139540 | A1 | 6/2009 | Lau | |
| 2010/0273291 | A1 * | 10/2010 | Kryliouk | C23C 16/303 438/99 |
| 2015/0255259 | A1 | 9/2015 | Li et al. | |

* cited by examiner

*Primary Examiner* — Angel Roman
(74) *Attorney, Agent, or Firm* — Schwabe, Williamson & Wyatt, P.C.

(57) ABSTRACT

Embodiments include a plasma processing method for cleaning polymer byproducts from interior surfaces of the plasma chamber. In an embodiment the plasma process may include processing a workpiece in a plasma processing chamber. Thereafter, the method may include removing the workpiece from the processing chamber. After the workpiece is removed, embodiments may include cleaning the plasma processing chamber with a cleaning process that includes a high pressure cleaning process, a first low pressure cleaning process, and a second low pressure cleaning process, wherein the second low pressure cleaning process includes applying a pulsed bias.

20 Claims, 7 Drawing Sheets

USING BIAS RF PULSING TO EFFECTIVELY CLEAN ELECTROSTATIC CHUCK (ESC)

BACKGROUND

1) Field

Embodiments relate to the field of semiconductor manufacturing and, in particular, to systems and methods for cleaning an electrostatic chuck (ESC) using bias RF pulsing.

2) Description of Related Art

As workpieces are processed in a plasma processing chamber, byproducts of the plasma process may be deposited on surfaces of the processing chamber, and exposed portions of the electrostatic chuck (ESC) that supports the workpiece during processing. The buildup of these byproducts may negatively affect the processing of subsequent workpieces. For example, the deposition of byproducts along sidewalls and the showerhead may result in the contamination of subsequently processed workpieces. Additionally, byproduct buildup between a insert ring and a sidewall of the ESC may result in helium leaks because subsequent workpieces may not sit flat on the ESC, $V_{RF}$ instability, and/or micro-arcing that produces an unstable plasma.

Accordingly, the processing chamber may need to be periodically cleaned in order to prevent the buildup of undesirable byproducts on the chamber surfaces. This cleaning process is typically implemented as an in-situ chamber clean that is often performed without a workpiece present on the ESC (i.e., a wafer-less in-situ chamber clean, or ICC). However, it has proven to be particularly difficult to remove the byproducts from between the ESC sidewall and the insert ring. For example, the gap between the ESC sidewall and the insert ring has a confined geometry that does not allow for effective cleaning. In order to drive the cleaning species into the gap between the ESC sidewall and the ring, some ICC processes include applying a constantly high DC bias to the ESC. However, this results in a high ion energy that damages the exposed ESC surface on which the workpiece sits. The damage to the ESC reduces the lifespan of the component and may result in dechucking, workpiece temperature drift, and other negative processing effects.

In some ICC processes, a protective coating may be applied to the ESC surface in order to protect the surface from damage. Once the cleaning is completed, the protective coating then must be removed as well. As such, this process increases the time needed to run the ICC. Additionally, if the protective coating is not completely removed, a workpiece may not sit properly on the ESC. This may produce results that are significantly similar to those described above with respect to the damaged ESC, and is therefore, undesirable as well.

SUMMARY

Embodiments include a plasma processing method for cleaning polymer byproducts from interior surfaces of the plasma chamber. In an embodiment the plasma process may include processing a workpiece in a plasma processing chamber. Thereafter, the method may include removing the workpiece from the processing chamber. After the workpiece is removed, embodiments may include cleaning the plasma processing chamber with a cleaning process that includes a high pressure cleaning process, a first low pressure cleaning process, and a second low pressure cleaning process where the second low pressure cleaning process includes applying a pulsed bias.

In an additional embodiment, the plasma processing method, may include processing a workpiece in a plasma processing chamber, where processing the workpiece results in a coating of polymer byproducts being deposited on surfaces of the plasma processing chamber. The embodiment may then include removing the workpiece from the processing chamber. Thereafter, embodiments may include cleaning the plasma processing chamber with a cleaning process that includes a high pressure cleaning process optimized to clean polymer byproducts deposited on a showerhead of the plasma processing chamber, a first low pressure cleaning process optimized to clean polymer byproducts deposited along sidewall surfaces of the plasma processing chamber, and a second low pressure cleaning process that includes applying a pulsed bias, where the second low pressure cleaning process is optimized to clean polymer byproducts formed along sidewalls of an electrostatic chuck. In an embodiment, the processing gas utilized for the second low pressure cleaning process is an oxidizing source.

DETAILED DESCRIPTION

Figure 1:
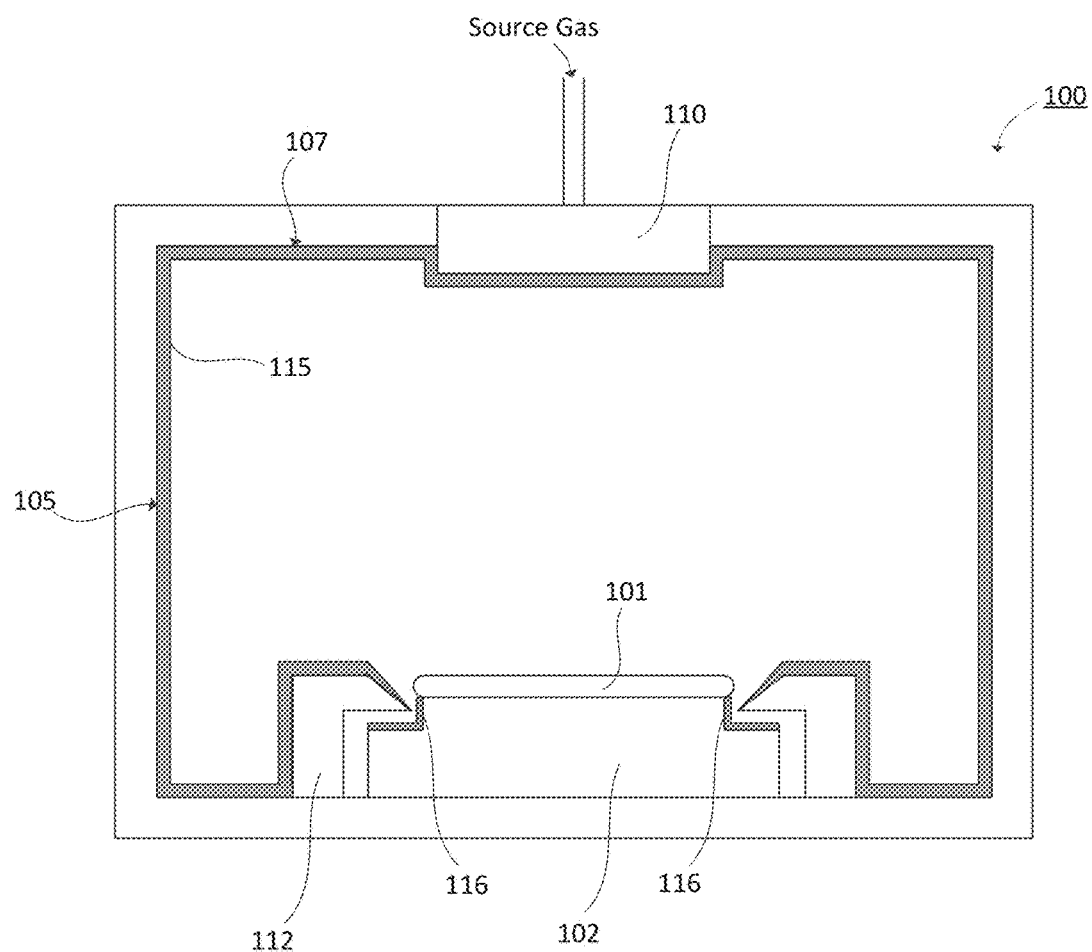
FIG. 1 is a cross-sectional illustration of a plasma processing chamber in which a plasma processing clean may be implemented in accordance with an embodiment.

Systems and methods for performing an in-situ chamber clean (ICC) are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, the removal of byproducts from between the ESC sidewall and the insert ring is critical for maintaining proper operation of the processing chamber. Accordingly, embodiments include a cleaning process that targets the removal of the byproducts between the ESC sidewall and the insert ring. The cleaning process may be optimized to remove the byproducts that are otherwise difficult to remove with typical cleaning processes due to the geometry of the ESC and the insert ring. Particularly, embodiments may include applying a bias to the ESC during the cleaning process in order to drive reactive species into the gap between the ESC and the insert ring. However, unlike previous attempts to clean the ESC sidewall by applying a constant bias to the ESC, embodiments include a pulsed bias. The application of a pulsed bias allows for the high ion energies needed to clean the byproducts from the ESC sidewall without damaging the exposed surface of the ESC. As such, the cleaning process allows for highly repeatable plasma processes while extending the lifespan of the ESC. This allows for increases in throughput since the ESC does not need to be replaced and/or repaired as well as lowering the cost to operate the plasma chamber.

Additionally, byproducts may be formed along the sidewalls and showerhead of the chamber as workpieces are processed in the chamber. These byproducts may be sources of contaminants that also negatively affect the processing of workpieces in the chamber. For example, during the processing of subsequent workpieces, the byproducts may redeposit on the workpieces. Accordingly, embodiments include a cleaning process that includes a plurality of sub-processes that are each targeted towards the removal of byproducts from certain regions of the processing chamber. In some embodiments, the cleaning process may include three or more sub-processes, (e.g., a first process for cleaning the showerhead, a second process for cleaning the sidewalls of the processing chamber, and a third process for cleaning the space between the ESC sidewall and the insert ring).

Each of the sub-processes may include source gases, pressures, temperatures, etc. that are optimized for the removal of byproducts from the particular regions of the processing chamber. While the sub-processes may each be optimized for a particular region of the processing chamber, it is to be appreciated that each sub-process may also contribute to the cleaning of other regions of the processing chamber. Furthermore, while being referred to as the first process, the second process, and the third process, it is to be appreciated that the processes may be implemented in any order, and that one or more of the process may optionally be omitted (e.g., not all sub-processes may need to be executed with the same frequency). The cleaning process may be performed after a fixed number of workpieces have been processed, after each workpiece has been processed, when a variation between processed workpieces exceeds a predetermined threshold, or at any other desired interval.

Referring now to FIG. 1, a cross-sectional schematic of a processing chamber 100 is shown, according to an embodiment. The processing chamber 100 may be any processing chamber capable of processing workpieces 101. For example, the processing chamber 100 may be a vacuum chamber suitable for the removal/and or deposition of materials from and/or onto a workpiece placed on a surface of the ESC 102. In a particular embodiment, the processing chamber 100 may be an etching chamber, such as a plasma etching chamber.

The processing chamber 100 illustrated in FIG. 1 depicts the state of the chamber after one or more workpieces have been processed (e.g., with an etching process). As shown, a coating 115 of byproducts have been deposited along the interior surfaces of the chamber 100, such as the sidewalls 105, the chamber lid 107, over surfaces of the showerhead (gas nozzle) 110, insert ring 112, etc. While the coating 115 is shown as being continuous with a uniform thickness, it is to be appreciated that the coating 115 may be non-continuous (i.e., some portions of the interior chamber surfaces may be exposed) and have a non-uniform thickness.

A particular portion of the coating 115 located along the sidewall of the ESC 102 (ESC sidewall byproduct coating 116) may cause additional problems beyond being a source of contamination. As noted above, excess ESC sidewall byproduct coating 116 may result in helium leaks, $V_{RF}$ instability, and/or micro-arcing that produces an unstable plasma. In the illustrated embodiment, a workpiece According to an embodiment, the byproduct coating 115/116 may be a polymeric material that is produced during the processing of workpieces 101 placed on the ESC 102.

Since a workpiece 101 is positioned over the top surface of the ESC 102 during processing, the top surface of the ESC 102 may be substantially exposed when the workpiece 101 is removed from the processing chamber 100 (i.e., substantially no byproduct coating 115/116 may be formed over a top surface of the ESC 102). Accordingly, during cleaning processes, such as cleaning processes disclosed in accordance with embodiments described herein, the top surface of the ESC may be susceptible to damage (e.g., erosion, corrosion, etc.) since there is no barrier protecting the ESC surface. As such, embodiments of the invention utilize cleaning processes that are designed to impart minimal damage to the top surface of the ESC 102. Therefore, cleaning processes in accordance with embodiments described herein, allow for extended service time before repairs and/or replacements of the ESC 102 are need in comparison with other previously known cleaning processes.

Figure 2:
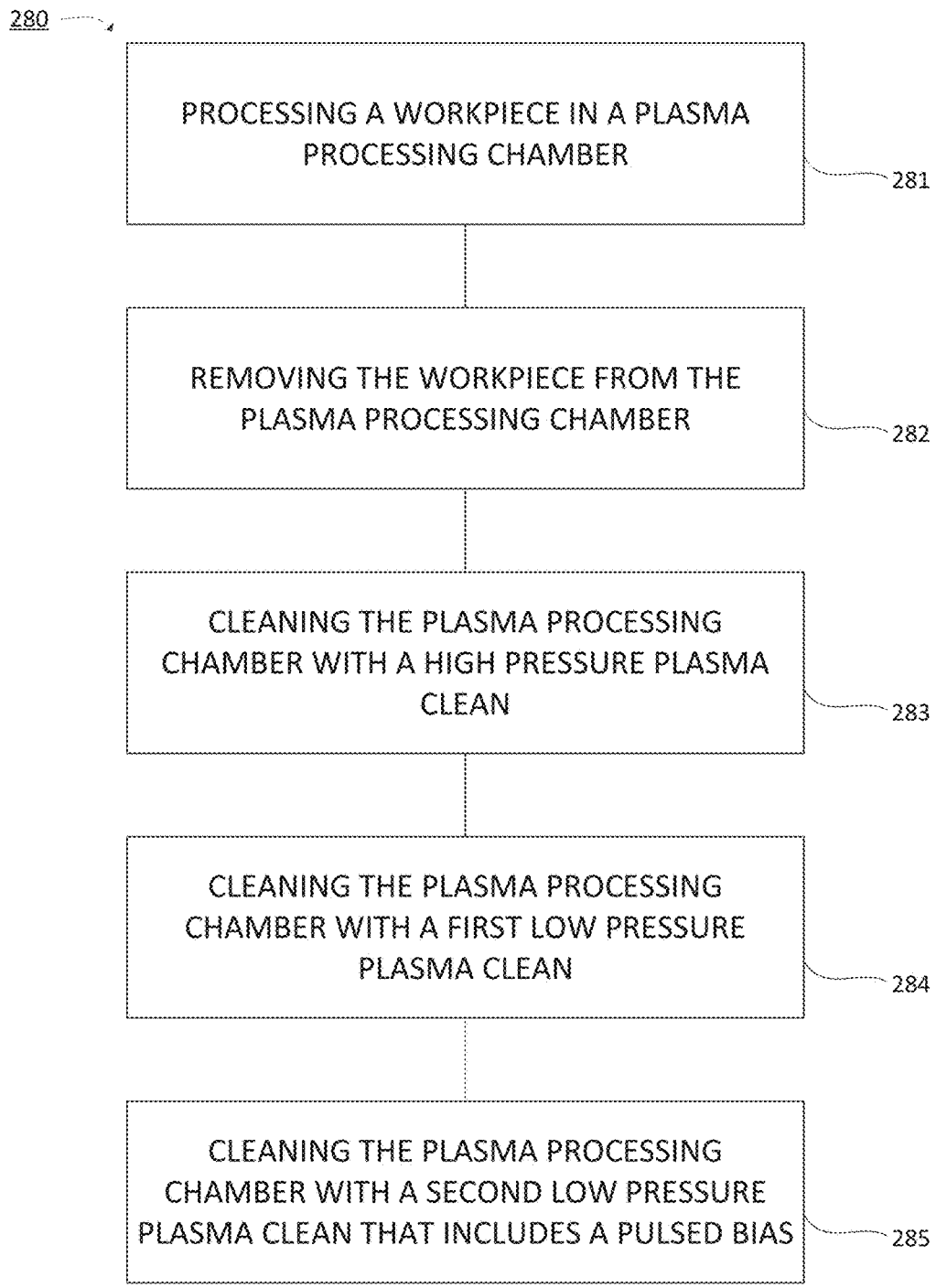
FIG. 2 is a flow diagram that describes a plasma process for cleaning a plasma processing chamber that includes a low pressure plasma clean with a pulsed bias, in accordance with an embodiment.

Referring now to FIG. 2, a flow diagram of a cleaning process 280 that may be used for cleaning a processing chamber 100 is shown, according to an embodiment. Method 280 may be implemented with a processing chamber 100, such as a plasma etching chamber or the like during the processing (e.g., etching) of one or more workpieces 101.

According to an embodiment, method 280 may begin with operation 281 which includes processing a workpiece. For example, the workpiece processing operation 281 may be any needed processing operation used to fabricate a device. Generally, a workpiece may be any workpiece conventionally employed in the fields of microelectronic, nanotechnology, photovoltaics, or the like. As one exemplary embodiment, the workpiece is a semiconductor wafer, such as, but not limited to silicon, germanium, or a commonly known III-V compound semiconductor material. As another embodiment, the workpiece is a glass or sapphire material. In general, any plasma process commonly employed in the art may be performed at operation 281. In certain embodiments, a plasma etching of a workpiece is performed at operation 281. Accordingly to an embodiment, operation 281 may include the processing of a single workpiece. Additional embodiments may include the processing of a plurality of workpieces (e.g., a batch of workpieces, a lot of workpieces, or any desired number of workpieces).

Referring now to operation 282, embodiments include removing the workpiece 101 from the plasma processing chamber 100. The cleaning process described herein may, therefore, be referred to as an in-situ chamber clean that is generally performed without a workpiece or dummy workpiece present on the chuck (i.e., a wafer-less, in-situ chamber clean, or ICC).

Figure 3A:
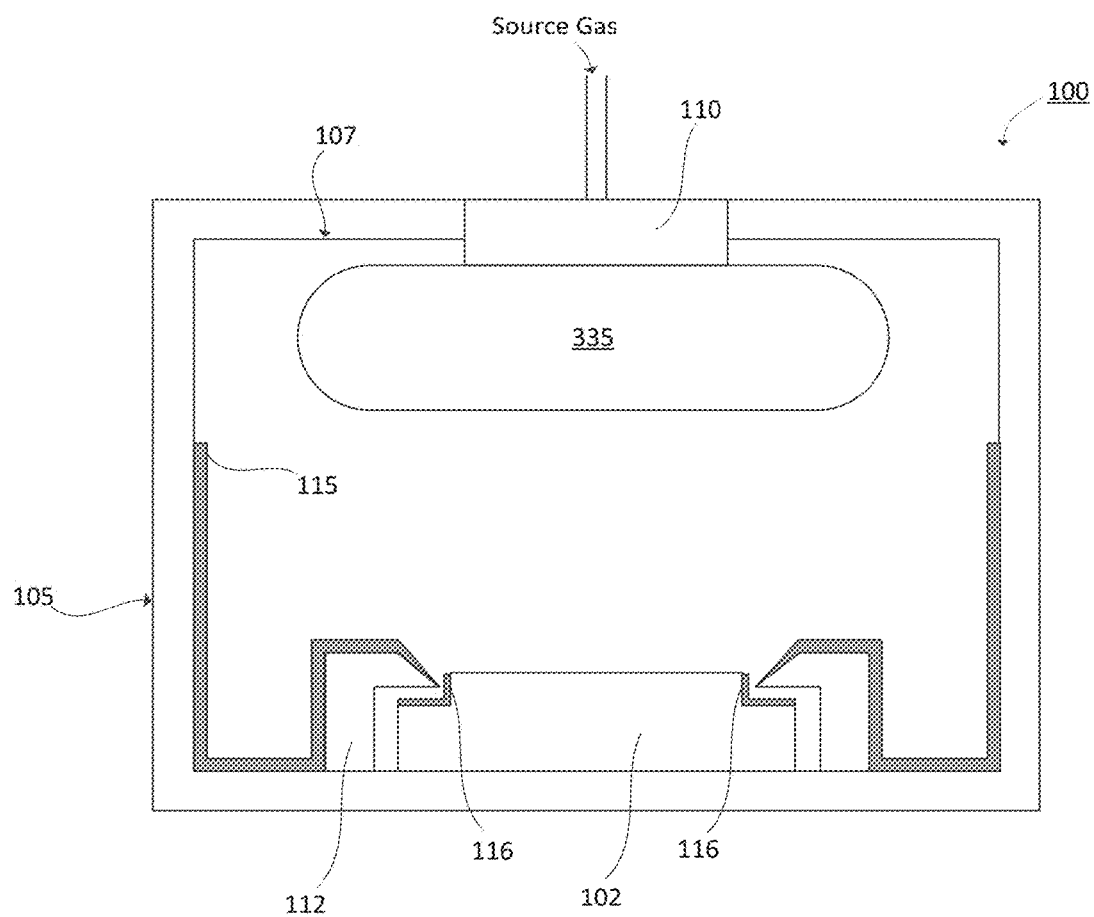
FIG. 3A is a cross-sectional illustration of a plasma processing chamber during a high pressure plasma clean, in accordance with an embodiment.

Referring now to operation 283, embodiments include cleaning the processing chamber with a high pressure plasma cleaning process. In an embodiment, the high pressure cleaning process 283 may be used to remove the coating 115 of polymer byproducts formed on a lid 107 of the chamber and the showerhead 110, as is illustrated in FIG. 3A. As shown, the plasma 335 is formed in an upper region of the processing chamber 100 in order to preferentially target the byproducts deposited along the showerhead 110 and the lid 107 of the chamber 100.

In an embodiment, the high pressure plasma clean includes utilizing a first process gas at a process pressure no less than 100 mT. In particular embodiments the high pressure plasma clean is performed at a pressure between 200 mT and 500 mT. In certain etch embodiments, the first process gas includes a pressure between 200 mT and 300 mT. Embodiments include a first processing gas that is an oxidizer, such as $O_2$, NO, CO, COS, and/or the like. According to an embodiment, the flow rate of the first processing gas may be between approximately 2,000 sccm and 3,500 sccm. The use of an oxidizer for the first processing gas is useful for cleaning polymers which may be deposited on the chamber walls during the workpiece etch operation 381. For certain embodiments, the high pressure clean is performed until an endpoint criteria is achieved indicating the carbonaceous polymers have been removed from the chamber, or the high pressure clean may be performed for a predetermined time.

According to an embodiment, the first process gas may also include one or more fluorine rich gases, such as $F_4$, $SF_6$, $NF_3$, or the like. Fluorine-based process gases are well-suited for etching most inorganic chamber coatings, such as the polymer byproducts. Inerts (e.g., He, Ar, or $N_2$, etc.) may also be added to the first process gases used during the high pressure clean. RF source power of between 1000 W and 4000 W may be utilized to energize the plasma with at least 1500 W offering an advantage of stability. RF bias power may be minimal to avoid damage to the chuck with the exemplary embodiment having an RF bias power of 0 W during the high pressure plasma clean.

Figure 3B:
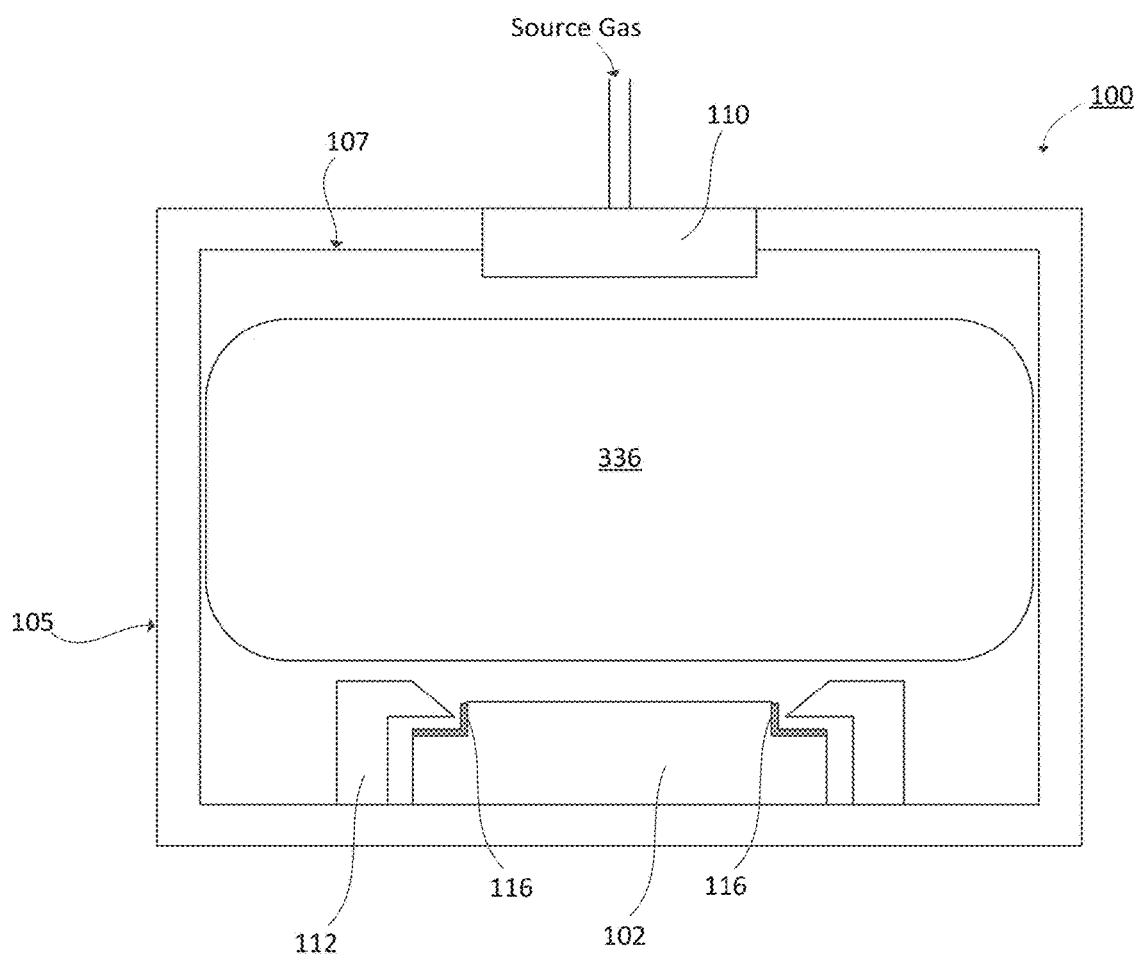
FIG. 3B is a cross-sectional illustration of a plasma processing chamber during a low pressure plasma clean, in accordance with an embodiment.

Referring now to operation 284, embodiments include cleaning the processing chamber with a first low pressure plasma cleaning process. As illustrated in FIG. 3B, the lower pressure allows the plasma 336 to spread throughout the processing chamber 100 in order to preferentially target the polymer byproducts deposited along the sidewalls 105 of the chamber 100. In embodiments, a plasma of the first process gas is generated at a process pressure less than that utilized in processing of the workpiece. In certain embodiments, a plasma of the second process gas is generated at a process pressure no greater than 50 mT. Generally, decreasing pressure below 50 mT will monotonically increase the mean free path, so pressures less than 15 mT are advantageous with pressures between 3 mT and 6 mT even more efficient at removing coatings 115.

In an embodiment, low pressure plasma cleaning operation 283 utilizes a second process gas including an oxidizing source and a relatively low process pressure. For example, the oxidizing source may include $O_2$, NO, CO, COS, and/or the like. In an embodiment, a mixing of other source gases may be avoided for the benefit of lowest process pressure. However, additional gases, such as fluorine-based process gases may also be included in the second process gas. While any of a number of known fluorine-based process gases, such as, $F_4$, $SF_6$, $NF_3$, or the like may be included in the second processing gas. In other embodiment, inerts such as He, Ar, or $N_2$, etc, may be added in small amounts for benefit of plasma stability. RF source power of between 1000 W and 4000 W may be utilized to energize the low pressure plasma with at least 2000 W offering an advantage of stability. RF bias power may be minimal to avoid damage to the chuck with the exemplary embodiment having an RF bias power of 0 W during the low pressure plasma clean.

Referring now to operation 385, embodiments include cleaning the processing chamber with a second low pressure plasma clean that includes a pulsed bias. In an embodiment, the biased low pressure plasma clean operation 385 may include a third processing gas. In an embodiment, the third processing gas may be an oxidizer, such as $O_2$, NO, CO, COS, or the like. In an embodiment, the biased low pressure plasma clean may be implemented at a process pressure no greater than 50 mT. As noted above, decreasing pressure will monotonically increase the mean free path. Accordingly, embodiments may include process pressures no greater than 30 mT. In yet another embodiment, the process pressure may be less than 10 mT. In an embodiment, the process pressure during the biased low pressure plasma clean operation 385 may be lower than a process pressure of the first low pressure plasma clean operation 384.

According to an embodiment, the flow rate of the third processing gas may be greater than 2,000 sccm. It is to be appreciated that with larger chamber volumes, the flow rate may need to be increased. For example, in advanced processing chambers 100 with larger volumes, the flow rate of the third processing gas may be 4,000 sccm or greater. Additional embodiments may include flow rates of the third processing gas that is between 5,000 sccm and 7,000 sccm.

Figure 3C:
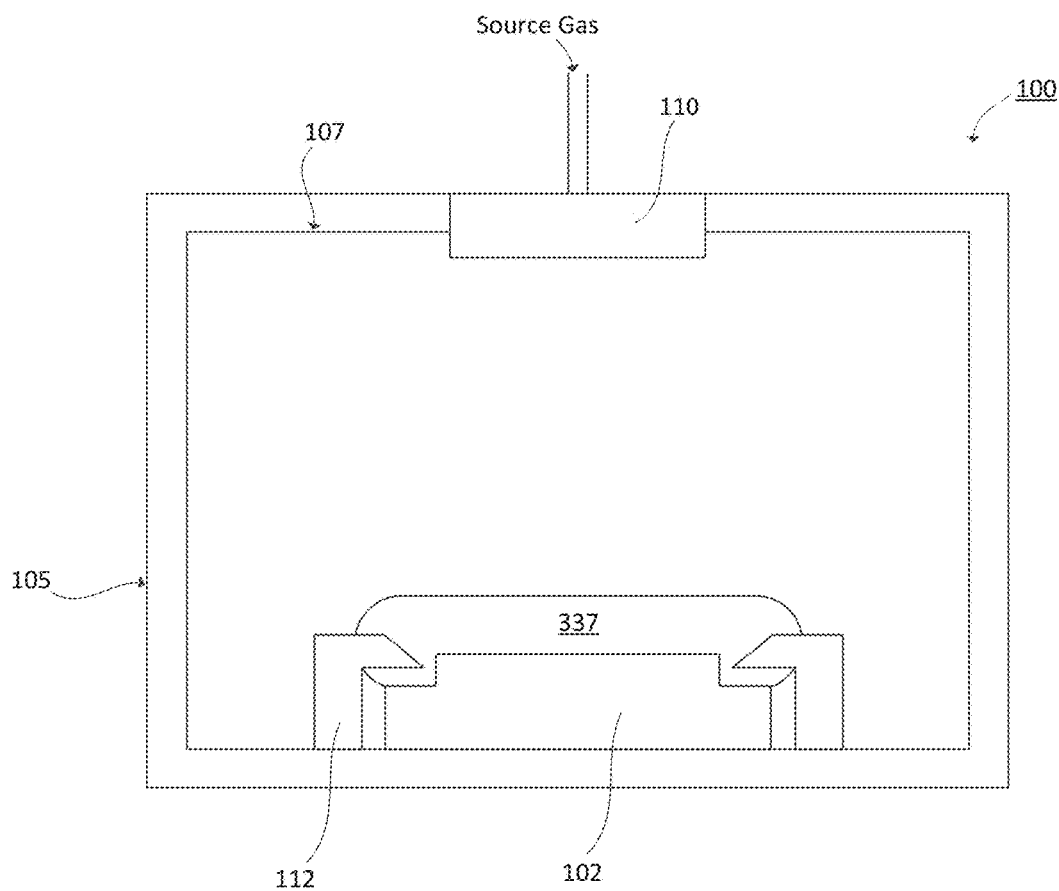
FIG. 3C is a cross-sectional illustration of a plasma processing chamber during a low pressure plasma clean with a pulsed bias, in accordance with an embodiment.

According to an embodiment, a pulsed bias may be applied. The pulsed bias allows for a temporary increase in the ion energy when the bias is applied, while reducing the ion energy when the bias is not being applied. As such, the coating 116 proximate to the sidewall of the ESC 102 may be removed effectively, while preventing damage to the surface of the ESC 102. As illustrated in FIG. 3C, the plasma 337 is localized around the ESC 102 in order to preferentially target the polymer byproducts deposited along the walls of the ESC 102 when the bias is applied. The increased ion energy allows for the reactive species to access the confined geometry between the insert ring 112 and the ESC 102 in order to effectively remove the polymer byproduct coating 116 formed along the sidewalls of the ESC 102.

Figure 4:
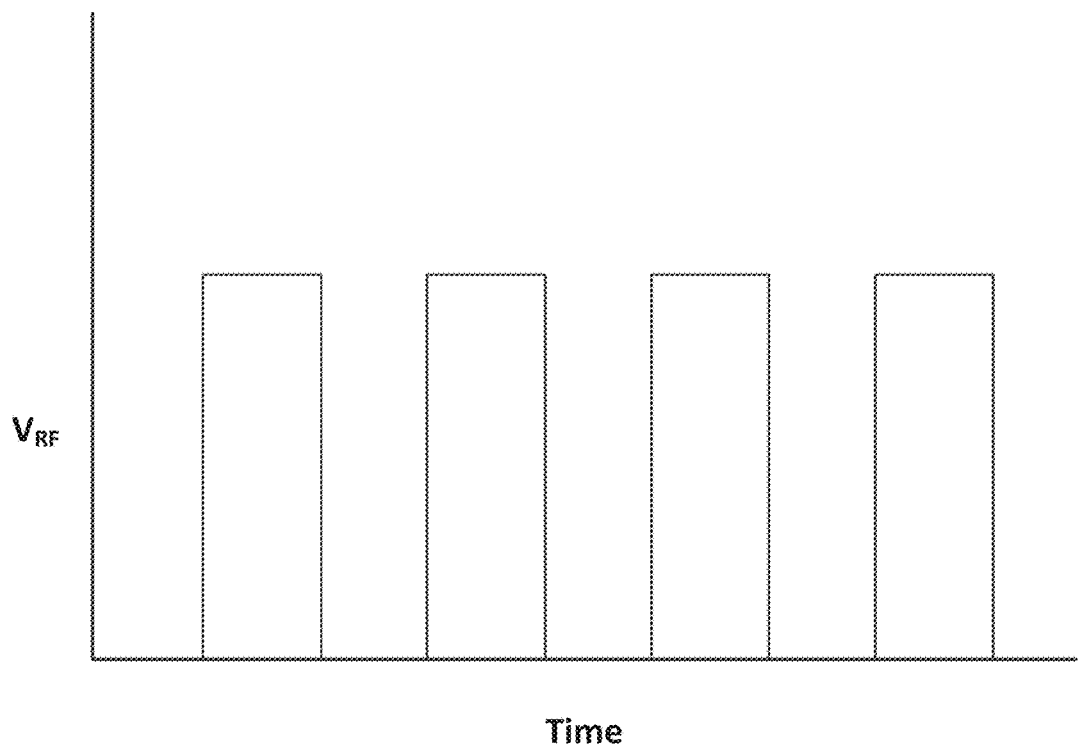
FIG. 4 is an illustration of an exemplary graph of the $V_{RF}$ versus time of the pulsed bias, in accordance with an embodiment.

Referring now to FIG. 4, a graph of the RF voltage ($V_{RF}$) versus time is shown according to an embodiment. The graph illustrates a generic pulsed cycle, however, it is to be appreciated that any pulsed bias condition may be used, depending on the needs of the device. For example, the duration of each pulse may be increased or decreased, and the percentage of time the bias is applied may be increased or decreased. In an embodiment, the pulses may have a duration between 1 ns and 100 ms. In a particular embodiment, a 2 MHz bias may be applied. Additional embodiments may include a bias that is a DC bias with the bias being applied between 1% and 99% of the duration of the cleaning process. Additional embodiments may include a DC bias with the bias being applied approximately 50% of the duration of the cleaning process.

Embodiments may also include increasing the temperature of the ESC 102 during the biased etching process. Increasing the temperature of the ESC 102 may result in an increase in the removal rate of the polymer byproduct coating 116. For example, the ESC 102 may be held at a temperature that is greater than a temperature used during the processing of workpieces in operation 381. In an embodiment, the ESC 102 may be held at a temperature that is greater than approximately 70° C. Additional embodiments may include holding the ESC 102 at a temperature that is between 80° C. and 90° C.

Figure 5:
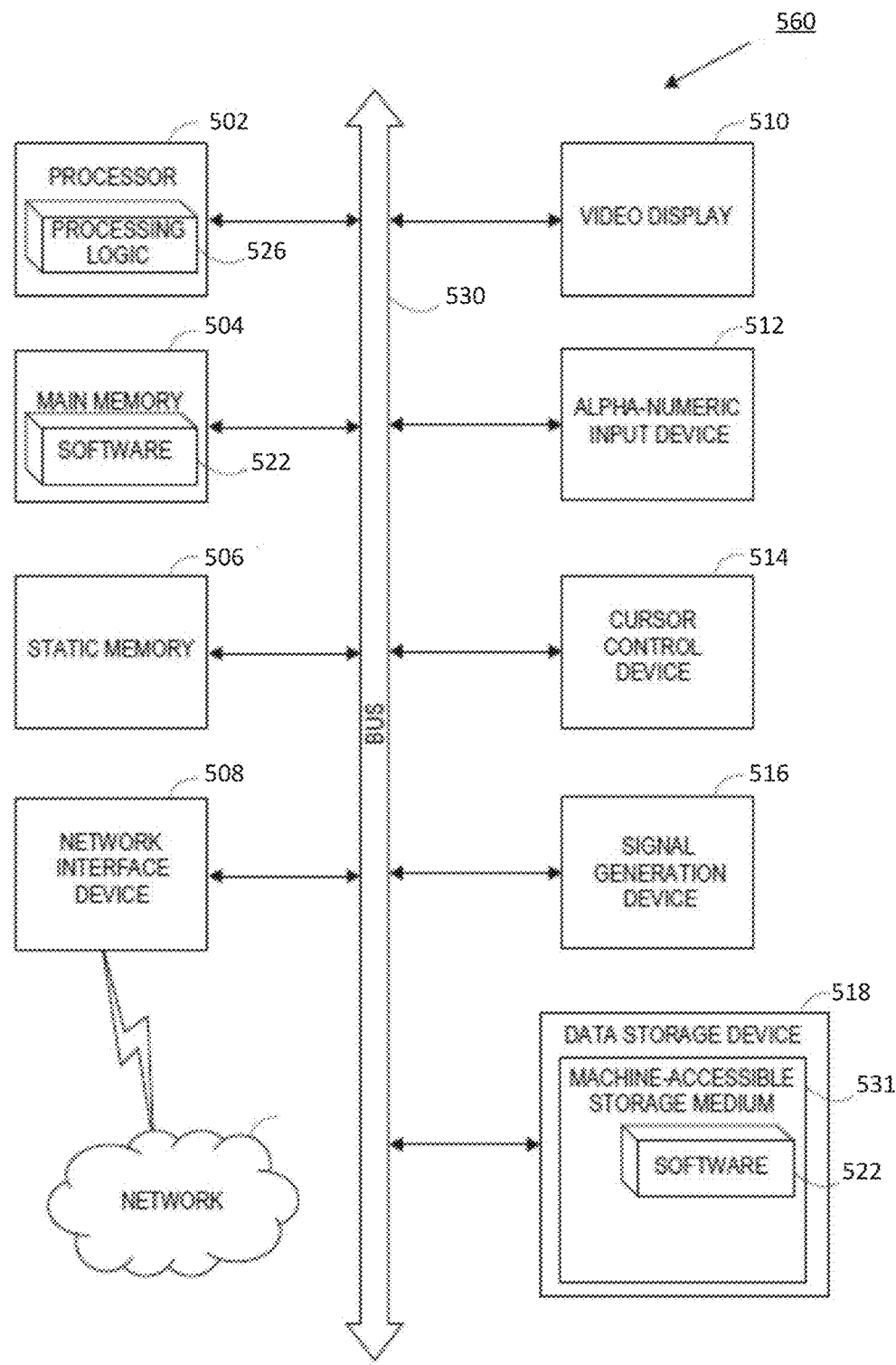
FIG. 5 illustrates a block diagram of an exemplary computer system that may be used in conjunction with processes that include cleaning a plasma processing chamber, in accordance with an embodiment.

Referring now to FIG. 5, a block diagram of an exemplary computer system 560 of a processing tool is illustrated in accordance with an embodiment. In an embodiment, computer system 560 is coupled to and controls processing in the processing tool. Computer system 560 may be connected (e.g., networked) to other machines in a Local Area Network (LAN), an intranet, an extranet, or the Internet. Computer system 560 may operate in the capacity of a server or a client machine in a client-server network environment, or as a peer machine in a peer-to-peer (or distributed) network environment. Computer system 560 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 560, the term "machine" shall also be taken to include any collection of machines (e.g., computers) that individually or jointly execute a set (or multiple sets) of instructions to perform any one or more of the methodologies described herein.

Computer system 560 may include a computer program product, or software 522, having a non-transitory machine-readable medium having stored thereon instructions, which may be used to program computer system 560 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 560 includes a system processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

System processor 502 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 502 may also be one or more special-purpose processing devices such as an application specific integrated circuit (ASIC), a field programmable gate array (FPGA), a digital signal system processor (DSP), network system processor, or the like. System processor 502 is configured to execute the processing logic 526 for performing the operations described herein.

The computer system 560 may further include a system network interface device 508 for communicating with other devices or machines. The computer system 560 may also include a video display unit 510 (e.g., a liquid crystal display (LCD), a light emitting diode display (LED), or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium 531 (or more specifically a computer-readable storage medium) on which is stored one or more sets of instructions (e.g., software 522) embodying any one or more of the methodologies or functions described herein. The software 522 may also reside, completely or at least partially, within the main memory 504 and/or within the system processor 502 during execution thereof by the computer system 560, the main memory 504 and the system processor 502 also constituting machine-readable storage media. The software 522 may further be transmitted or received over a network 520 via the system network interface device 508.

While the machine-accessible storage medium 531 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A plasma processing method, comprising:
processing a workpiece in a plasma processing chamber;
removing the workpiece from the processing chamber;
cleaning the plasma processing chamber with a cleaning process that comprises a high pressure cleaning process, a first low pressure cleaning process, and a second low pressure cleaning process, wherein the second low pressure cleaning process includes applying a pulsed bias.

2. The plasma processing method of claim 1, wherein the second low pressure cleaning process utilizes a processing gas comprising an oxidizing source gas.

3. The plasma processing method of claim 2, wherein the oxidizing source gas includes one or more of $O_2$, NO, CO, COS.

4. The plasma processing method of claim 2, wherein the process pressure of the second low pressure cleaning process incudes a process pressure that is approximately 50 mT or less.

5. The plasma processing method of claim 4, wherein the process pressure of the second low pressure cleaning process includes a process pressure that is less than approximately 30 mT.

6. The plasma processing method of claim 4, wherein the second low pressure cleaning process includes a process pressure that is less than a processing pressure of the first low pressure cleaning process.

7. The plasma processing method of claim 4, wherein the flow rate of the oxidizing source is at least 2,000 sccm.

8. The plasma processing method of claim 6, wherein the flow rate of the oxidizing source is between approximately 5,000 sccm and 7,000 sccm.

9. The plasma processing method of claim 1, wherein the second low pressure cleaning process further comprises increasing a temperature of an electrostatic chuck in the processing chamber to a temperature that is greater than a temperature of the electrostatic chuck utilized during the processing of the workpiece.

10. The plasma processing method of claim 9, wherein the temperature of the electrostatic chuck is increased to greater than approximately 70° C.

11. The plasma processing method of claim 1, wherein the bias is a 2 MHz bias.

12. The plasma processing method of claim 1, wherein the pulsed bias is a DC bias with the bias being applied between 1% and 99% of the duration of the second low pressure cleaning process.

13. The plasma processing method of claim 7, wherein the bias is applied for approximately 50% of the duration of the cleaning process.

14. The plasma processing operation of claim 1, wherein processing a workpiece in a plasma processing chamber comprises processing a plurality of workpieces, wherein the plurality of workpieces are processed in the plasma processing chamber sequentially until a variation between processed workpieces exceeds a predetermined threshold.

15. A cleaning process for a plasma chamber, comprising:
removing a workpiece from the processing chamber; and
implementing a high pressure cleaning process and then a low pressure cleaning process, the low pressure cleaning process at a processing pressure that is less than 50 mT with an oxidizing source gas, wherein the low pressure cleaning process includes applying a pulsed bias.

16. The processing method of claim 15, wherein the flow rate of the oxidizing source gas is greater than approximately 2,000 sccm.

17. The processing method of claim 15, further comprising increasing a temperature of an electrostatic chuck in the plasma chamber.

18. The method of claim 15, wherein the bias is a 2 MHz bias.

19. A plasma processing method, comprising:
processing a workpiece in a plasma processing chamber, wherein processing the workpiece results in a coating of polymer byproducts being deposited on surfaces of the plasma processing chamber;
removing the workpiece from the processing chamber;
cleaning the plasma processing chamber with a cleaning process that comprises a high pressure cleaning process optimized to clean polymer byproducts deposited on a showerhead of the plasma processing chamber, a first low pressure cleaning process optimized to clean polymer byproducts deposited along sidewall surfaces of the plasma processing chamber, and a second low pressure cleaning process, wherein the second low pressure cleaning process includes applying a pulsed bias, wherein the second low pressure cleaning process is optimized to clean polymer byproducts formed along sidewalls of an electrostatic chuck, and wherein a processing gas utilized for the second low pressure cleaning process is an oxidizing source.

20. The processing method of claim 19, wherein the oxidizing source gas is $O_2$, and wherein the flow rate of the oxidizing source gas is greater than approximately 2,000 sccm.

* * * * *